United States Patent
Jo

(10) Patent No.: US 8,257,886 B2
(45) Date of Patent: Sep. 4, 2012

(54) PHASE SHIFT MASK WITH ENHANCED RESOLUTION AND METHOD FOR FABRICATING THE SAME

(75) Inventor: Sang Jin Jo, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 304 days.

(21) Appl. No.: 12/633,494

(22) Filed: Dec. 8, 2009

(65) Prior Publication Data

US 2010/0233588 A1  Sep. 16, 2010

(30) Foreign Application Priority Data

Mar. 10, 2009  (KR) .................. 10-2009-0020242

(51) Int. Cl.
*G03F 1/26* (2012.01)
(52) U.S. Cl. .......................................... 430/5
(58) Field of Classification Search ............. 430/5, 322, 430/323, 324, 394; 438/633
See application file for complete search history.

(56) References Cited

U.S. PATENT DOCUMENTS

| | | | | |
|---|---|---|---|---|
| 5,882,824 A | * | 3/1999 | Kim | 430/5 |
| 7,678,509 B2 | * | 3/2010 | Suda | 430/5 |
| 2003/0194614 A1 | | 10/2003 | Lin | |
| 2006/0099521 A1 | | 5/2006 | Park et al. | |
| 2006/0292454 A1 | * | 12/2006 | Suda | 430/5 |

FOREIGN PATENT DOCUMENTS

| | | |
|---|---|---|
| JP | 2006-171335 A | 6/2006 |
| KR | 10-0190088 | 1/1999 |
| KR | 10-2001-0003262 | 1/2001 |
| KR | 10-2008-0099913 | 11/2008 |

* cited by examiner

*Primary Examiner* — Stephen Rosasco
(74) *Attorney, Agent, or Firm* — Marshall, Gerstein & Borun LLP

(57) ABSTRACT

A method for fabricating a phase shift mask includes obtaining a layout of a mask region which sets up a light transmitting region; obtaining a layout of a phase shift region placed in a border portion of the mask region by disposing a shadow core region for light-shielding in a middle portion of the mask region; forming phase shift patterns following the layout of the phase shift region on a light transmitting substrate; and forming a shadow core layer pattern which exposes a portion of the substrate corresponding to the light transmitting region between the phase shift patterns and covering and light-shielding the portion of the substrate corresponding to the shadow core region, and a mask fabricated by the method.

11 Claims, 7 Drawing Sheets

PHASE SHIFT MASK WITH ENHANCED RESOLUTION AND METHOD FOR FABRICATING THE SAME

CROSS-REFERENCE TO RELATED APPLICATIONS

The present application claims priority to Korean patent application number 10-2009-0020242, filed on Mar. 10, 2009, which is incorporated by reference in its entirety.

BACKGROUND OF THE INVENTION

The present invention relates to photolithography technology, and more particularly, to a phase shift mask with enhanced resolution and a method for fabricating the same.

With increases in an integration degree of a semiconductor device, a critical dimension of circuit patterns becomes finer and finer. In order to form these fine patterns, a phase shift mask capable of enhancing a resolution is used in an exposure process. A dose of exposure light incident to high density patterns in which a gap between the patterns is relatively narrow is relatively raised, and a defect that patterns with a desired size cannot be formed can be caused as a dose more than a proper level is undesirably incident. This can be caused as the dose incident on respective patterns affects adjacent patterns due to the increased pattern density and thus the dose incident on the wafer is actually increased.

In order to restrict this increase in the dose, conventional solutions have included reducing the dose of an exposure light source itself used in the exposure process and using a high sensitive photoresist exposable by the exposure light source with the reduced dose. However, light incident on the wafer through a phase shift layer of the phase shift mask also has the dose more than a predetermined level; a peripheral portion of the light is extinguished by destructive interference with other light passed through an adjacent light transmitting portion but the dose of the light passed through the middle portion of the phase shift layer is transferred onto the wafer as it is. Therefore, when using the photoresist with higher sensitivity, unnecessary dose is incident on the photoresist to expose the photoresist. Consequently, this functions as a restriction factor obstructing the formation of finer patterns.

FIG. 1 is a sectional view illustrating a phase shift mask and FIG. 2 is a view showing a dose and a phase of light transmitted through the phase shift mask of FIG. 1.

Referring to FIG. 1, the phase shift mask is provided with a phase shift layer pattern 13 such as a molybdenum (Mo)-silicon (Si) alloy layer on a transparent quartz substrate 10. The phase shift layer pattern 13 has a shape for providing the shape of circuit patterns to be transferred on the wafer and an exposed region of the substrate 10 is set up as a light transmitting part 11.

Referring to FIG. 2, in distributions in phase and dose of the exposure light incident on the phase shift mask and transferred onto the wafer during the exposure process, it is effective that a first dose 21, an intensity of a first light transmitted through the light transmitting part 11 is more than a critical dose and a second dose, an intensity of a second light transmitted through the phase shift layer pattern 13 is lower than the critical dose. At this time, a phase 31 of the first light is an opposite phase (phase difference of 180°) to a phase 33 of the second light and induces that, in a destructive interference region, i.e. a boundary region, a destructive interference occurs therebetween and thus the light dose becomes substantially zero. Accordingly, a contrast in the boundary region of the phase shift pattern 13 is increased.

However, the portion of the second light transmitted through the middle portion of the phase shift layer pattern 13 is not destructed but transferred onto the wafer. The second dose 23 or an intensity of the second light transmitted through the phase shift layer pattern 13 should be controlled to have a dose less than the critical dose which is the limitation not exposing the photoresist on the wafer, but an over dose phenomenon, in that the second light dose 23 exceeds the critical dose by the reduction of the critical dose, can be caused when using a photoresist with higher sensitivity required to form finer patterns. In this case, there can occur an exposed pattern defect in that the region of the photoresist corresponding to the phase shift layer pattern 13 is also exposed and patterned.

Accordingly, it may be contemplated to reduce the dose 23 of the second light transmitted through the phase shift layer pattern 13 by increasing a thickness of the phase shift layer pattern 13. However, since a quartz substrate is used in the fabrication of the phase shift mask and a variation in the thickness of the phase shift layer pattern 13 causes a phase shift of the second light transmitted through the phase shift layer pattern 13, the variation in the thickness of the phase shift layer pattern 13 can lead to lowering in performance of the phase shift mask. Therefore, it is required to develop an enhanced phase shift mask capable of reducing the light dose 23 of the second light transmitted through the phase shift layer pattern 13 with variation in the thickness or material of the phase shift layer being restricted.

SUMMARY OF THE INVENTION

In one embodiment, a method for fabricating a phase shift mask includes obtaining a layout of a mask region which sets up a light transmitting region; obtaining a layout of a phase shift region placed in a border portion of the mask region by disposing a shadow core region for light-shielding in a middle portion of the mask region; forming phase shift patterns following the layout of the phase shift region on a light transmitting substrate; and forming a shadow core layer pattern which exposes a portion of the substrate corresponding to the light transmitting region between the phase shift layer patterns and covering and light-shielding the portion of the substrate corresponding to the shadow core region.

In another embodiment, a method for fabricating a phase shift mask includes obtaining a layout of a mask region which sets up a light transmitting region; obtaining a layout of a phase shift region placed in a border portion of the mask region by disposing a shadow core region for light-shielding in a middle portion of the mask region; introducing a light transmitting substrate on which a phase shift layer and a light shielding layer are sequentially stacked; forming a stacked pattern of a light shielding layer pattern and a phase shift layer pattern in a shape following the layout of the phase shift region by selectively etching the light shielding layer and the phase shift layer; forming a sacrificial layer pattern which selectively exposes a portion of the substrate between the stacked patterns corresponding to the shadow core region; forming a shadow core layer covering and light-shielding the portion of the substrate exposed by the sacrificial layer pattern; planarizing the shadow core layer so that the light shielding layer is exposed; exposing a portion of the substrate corresponding to the light transmitting region by removing a remaining portion of the sacrificial layer pattern; and maintaining the shadow core layer pattern between the phase shift layer patterns by recessing the light shielding layer pattern and the shadow core layer pattern so that the phase shift layer pattern is exposed.

Preferably, the forming of the stacked pattern of the light shielding layer pattern and the phase shift layer pattern includes: forming a first resist layer on the light shielding layer; forming a first resist pattern by first electron beam exposure and first development so that the layout of the phase shift region is transferred to the first resist layer; and forming the stacked pattern of the light shielding layer pattern and the phase shift layer pattern by selectively etching the light shielding layer and the phase shift layer using the first resist pattern as an etch mask.

Preferably, the forming of the sacrificial layer pattern includes forming a second resist layer which covers the stacked pattern; and forming a second resist pattern which exposes the portion of the substrate between the stacked patterns corresponding to the shadow core region by second electron beam exposure and second development.

Preferably, the forming of the shadow core layer includes: depositing a chromium (Cr) layer, which is equal to the light shielding layer, on the second resist layer.

Preferably, the planarizing of the shadow core layer includes exposing a surface of the light shielding layer pattern by sequentially chemical mechanical polishing the shadow core layer and the second resist pattern therebelow.

In another embodiment, a phase shift mask includes phase shift layer patterns formed on a light transmitting substrate following a layout of a phase shift region set up so as to be placed in a border portion of a mask region as a shadow core region for light-shielding is disposed in a middle portion of the mask region which sets up a light transmitting region; and a shadow core layer pattern for exposing a portion of the substrate corresponding to the light transmitting region between the phase shift layer pattern and covering and light-shielding a portion of the substrate corresponding to the shadow core region between the phase shift layer patterns.

Preferably, the shadow core layer pattern has a thickness equal to that of the phase shift layer pattern.

DESCRIPTION OF SPECIFIC EMBODIMENTS

Hereinafter, a method for fabricating a fine pattern in accordance with the present invention will be described in detail with reference to the accompanying drawings.

In embodiments of the present invention, in order to form finer patterns using a photoresist with higher sensitivity during an exposure process, a middle portion of the phase shift layer is selectively removed and a shadow core layer for light-shielding is introduced in the removed portion using a chromium (Cr) light shielding layer to reduce intensity of light transmitted through the phase shift layer. Since the shadow core can reduce the intensity or light dose of the light transmitted through a region which induces phase shift, intensity of light incident on a photoresist on a wafer can be reduced and a thickness of the photoresist can thus be further reduced. Accordingly, because the photoresist layer can sense more minute intensity differences in the incident light and thus be selectively exposed by regions, it is possible to transfer finer patterns on the wafer.

FIGS. 3 through 12 illustrate a phase shift mask and a method for fabricating the same in accordance with an embodiment of the present invention.

Figure 1:
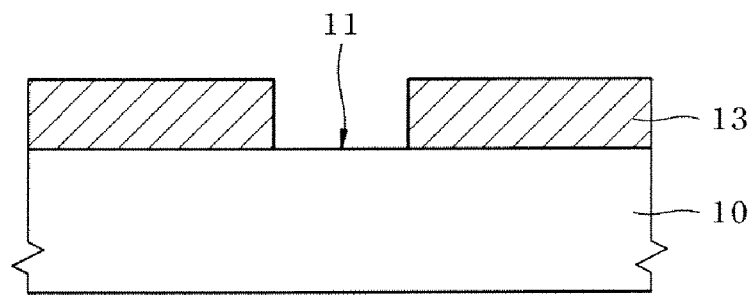
FIG. 1 is a sectional view illustrating a structure of a conventional phase shift mask.
Figure 2:
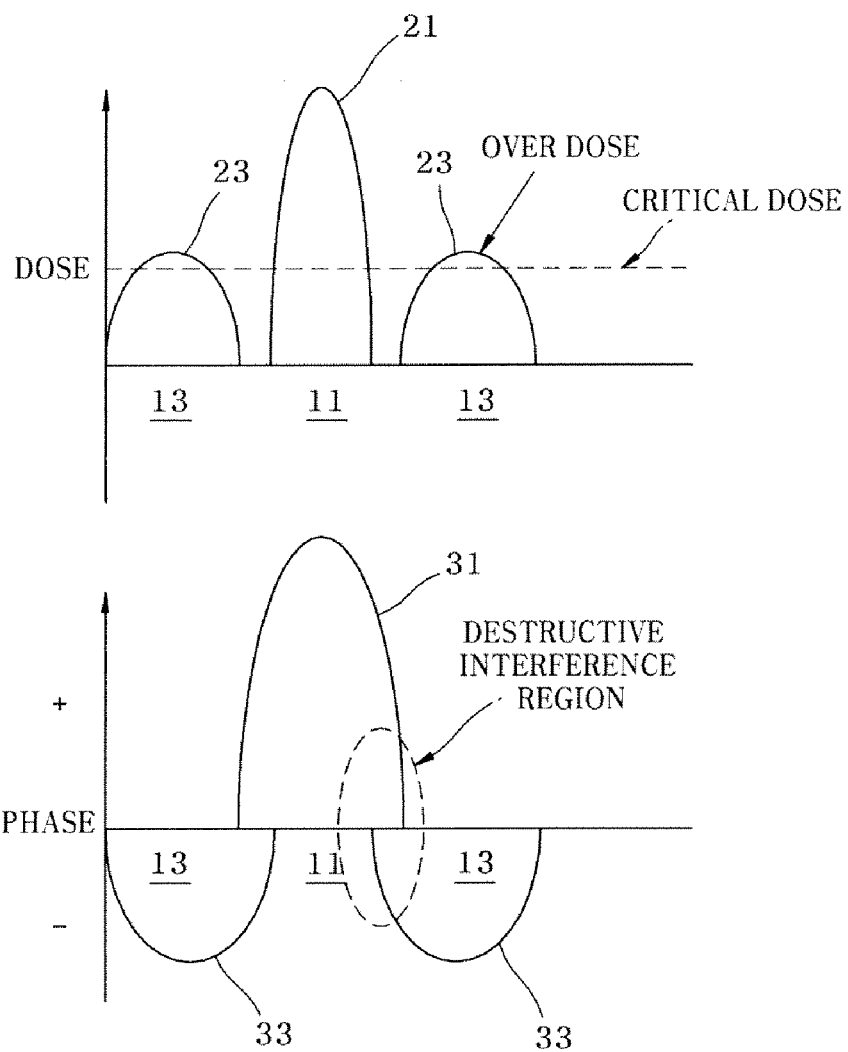
FIG. 2 is a view illustrating light dose and phase of light transmitted through the phase shift mask of FIG. 1.
Figure 3:
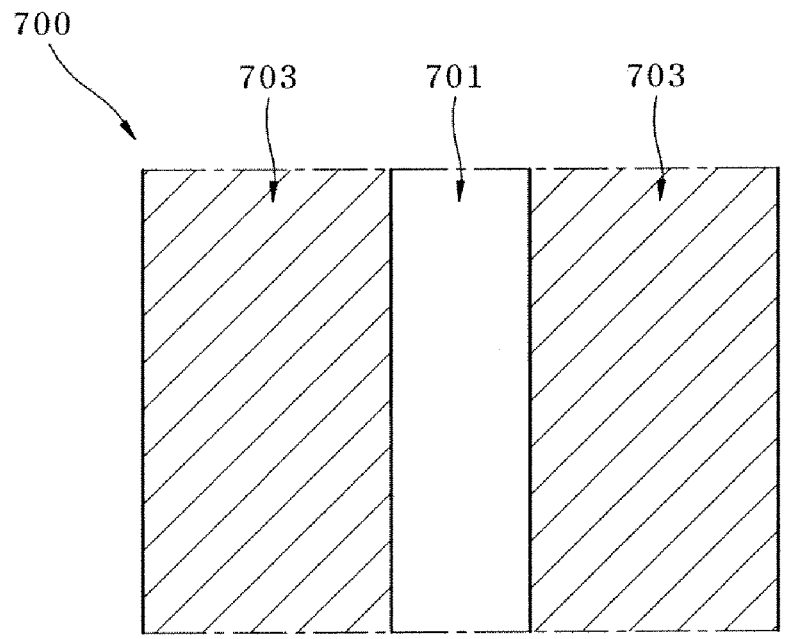
FIG. 3 is a plan view illustrating a layout of a mask region of a phase shift mask in accordance with an embodiment of the present invention.

Referring to FIG. 3, a layout 700 of a mask region 703 which sets up a light transmitting region 701 is obtained. Light transmitted through the light transmitting region 701 and transferred onto a wafer (not shown) among exposure light incident on a phase shift mask should have a light dose capable of substantially exposing a layer (not shown) of a photoresist on the wafer. Accordingly, the light transmitting region 701 is a region in which loss of intensity or light dose of the exposure light is substantially restricted, and is set up as a region in which a transparent quartz substrate is exposed.

This mask region 703 which sets up the light transmitting region 701 is designed following a shape of circuit patterns to be transferred onto the wafer through an exposure process, and phase shift layer patterns are generally disposed on a region of the substrate corresponding to the mask region 703. In an embodiment of the present invention, a shadow core is disposed as a light shielding pattern for light-shielding in a middle portion of the mask region 703 in which the phase shift layer pattern is to be disposed.

Figure 4:
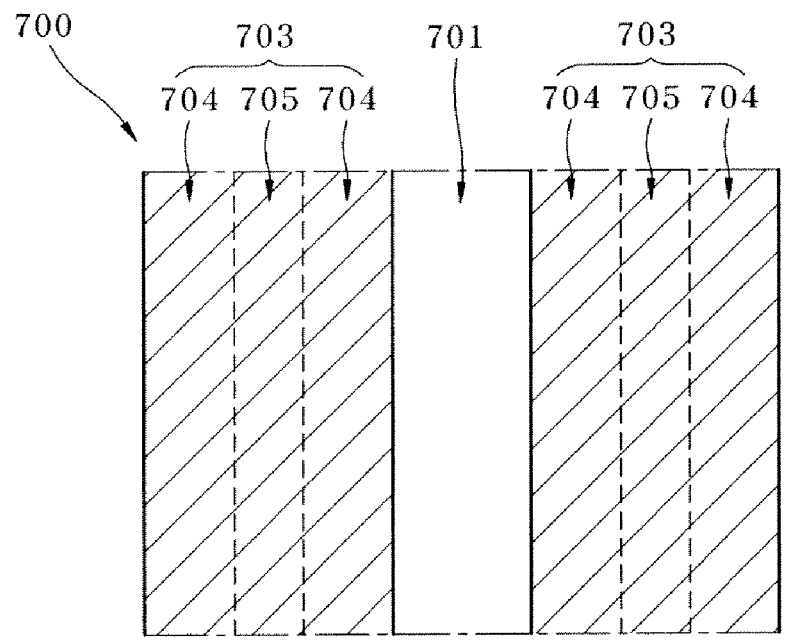
FIG. 4 is a plan view illustrating a layout of a phase shift region set up in the layout of the mask region of the phase shift mask in accordance with an embodiment of the present invention.

To this end, as illustrated in FIG. 4, the region 705 in which the shadow core is to be disposed in the middle of the mask region 703 and border portions at both sides of the mask region 703 are set up as a phase shift region 704 in which the phase shift layer pattern is to be actually disposed. At this time, a width of the phase shift region 704 can be determined experimentally so that a phase shifted first light transmitted through the phase shift region 704 and a second light transmitted through the light transmitting region 701 substantially have a phase difference of 180° and an image contrast of the pattern transferred through the exposure process is thus enhanced. Also, the width of the phase shift region 704 can be determined depending on a width of the shadow core region 705, and the width of the shadow core region 705 can be determined experimentally so that the intensity or light dose of the first light transmitted through the phase shift region 704 and transferred onto the wafer becomes smaller than the critical dose exposing the layer of the photoresist on the wafer and an actual exposure is thus restricted.

Figure 5:
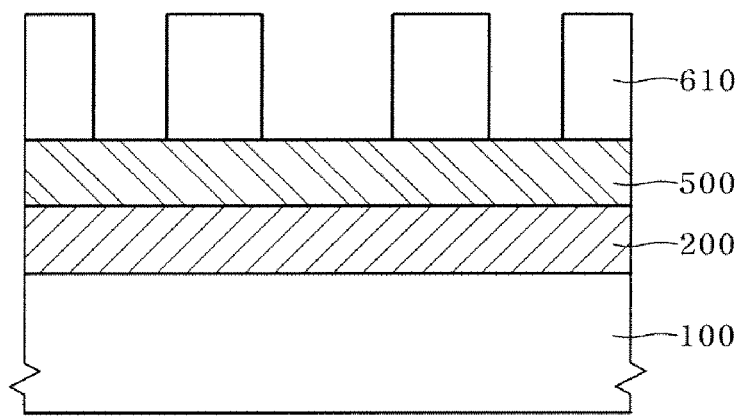
FIGS. 5 through 12 are sectional views illustrating the phase shift mask and a method for fabricating the same in accordance with an embodiment of the present invention.

Referring to FIG. 5, the layout 700 in which the phase shift region 703, the shadow core region 705 and the light transmitting region 701 are set up is realized on a transparent light transmitting substrate 100 or a light transmitting layer such as a quartz substrate. The substrate 100 used in the fabrication of the phase shift mask can be introduced as a blank mask substrate which is provided with a molybdenum (Mo) alloy layer to be used as a phase shift layer 200, a chromium (Cr) light shielding layer 500 and a first resist layer. This blank mask substrate can be introduced in a state that deposition of the molybdenum layer, deposition of the chromium layer and application of the first resist layer is completed.

Onto the first resist layer of this substrate 100, the layout 700 of FIG. 4, in which the phase shift region 703, the shadow core region 705 and the light transmitting region 701 are designed, is transferred by an electron beam exposure, etc.

After that, the first resist layer exposed by the electron beam is developed to form a first resist pattern 610 having a shape following the layout of the phase shift region (704 of FIG. 4) on the light shielding layer 500.

Figure 6:
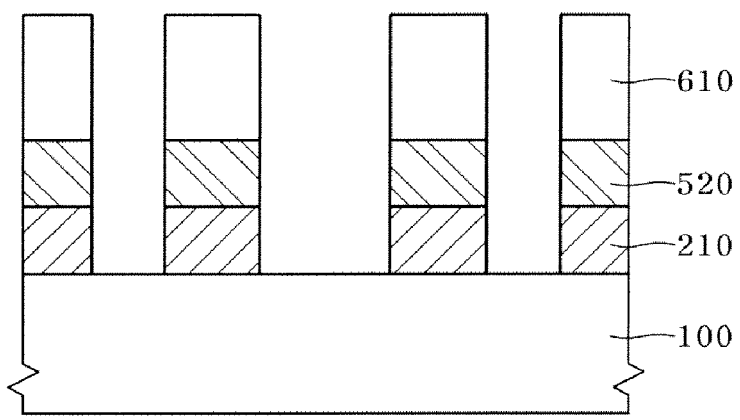

Referring to FIG. 6, the portion of the light shielding layer 500 exposed by the first resist pattern 610 is selectively etched to form a light shielding layer pattern 520, and the portion of the phase shift layer 200 exposed by the patterning of the light shielding layer pattern 520 is etched to form a phase shift layer pattern 210. Accordingly, the light shielding layer pattern 520 and the phase shift layer pattern 210 are patterned to a shape following the layout of the phase shift region (704 of FIG. 4). After that, the first resist pattern 610 is selectively stripped.

Figure 7:
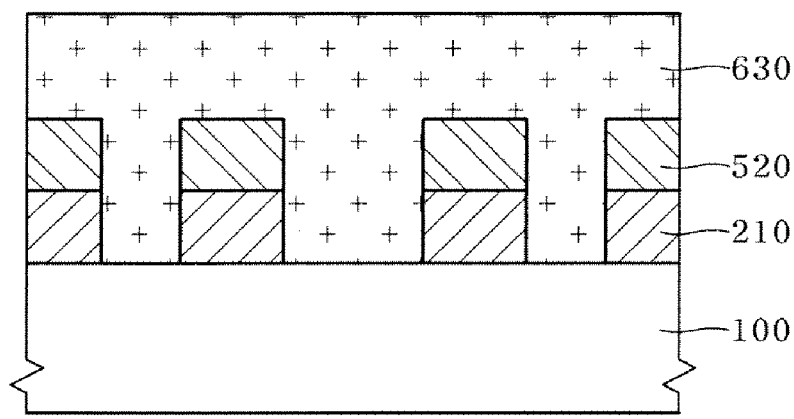

Referring to FIG. 7, a second resist layer 630 is applied as a sacrificial layer which covers the light shielding layer 520 and the phase shift layer pattern 210. The sacrificial layer is introduced to form the shadow core, and can be introduced with a second resist layer 630 which has an advantage of easy patterning and removal since it will be removed in a subsequent process. Nevertheless, if necessary, the sacrificial layer can be introduced with an inorganic layer such as a silicon oxide layer. When other material layers other than the second resist layer 630 are introduced, a separate process for the patterning can be further introduced.

Figure 8:
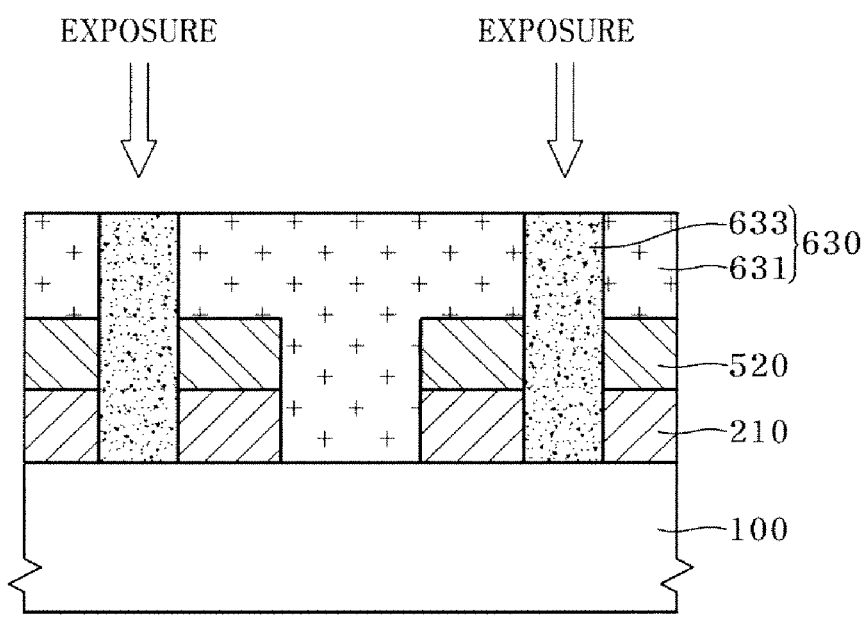

Referring to FIG. 8, the second resist layer 630 is selectively exposed by an electron beam exposure, etc. At this time, since the selective exposure process is performed following the layout of the shadow core region (705 of FIG. 4), a non-exposed portion 631 is maintained to cover the region on the substrate 100 corresponding to the phase shift region (704 of FIG. 4) and the light transmitting region (701 of FIG. 4) and the exposed portion 633 is located in the portion of the substrate 100 corresponding to the shadow core region 705.

Figure 9:
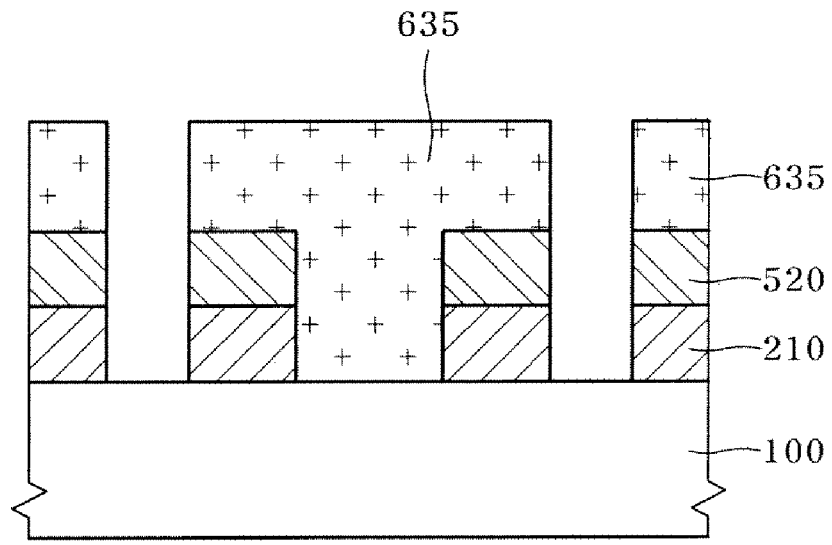

Referring to FIG. 9, the exposed portion 633 is selectively removed to form the second resist pattern 635 as a sacrificial layer pattern. The second resist pattern 635 is formed so as to expose a surface of the portion of the substrate 100 corresponding to the shadow core region (705 of FIG. 4) between the phase shift layer patterns 210.

Figure 10:
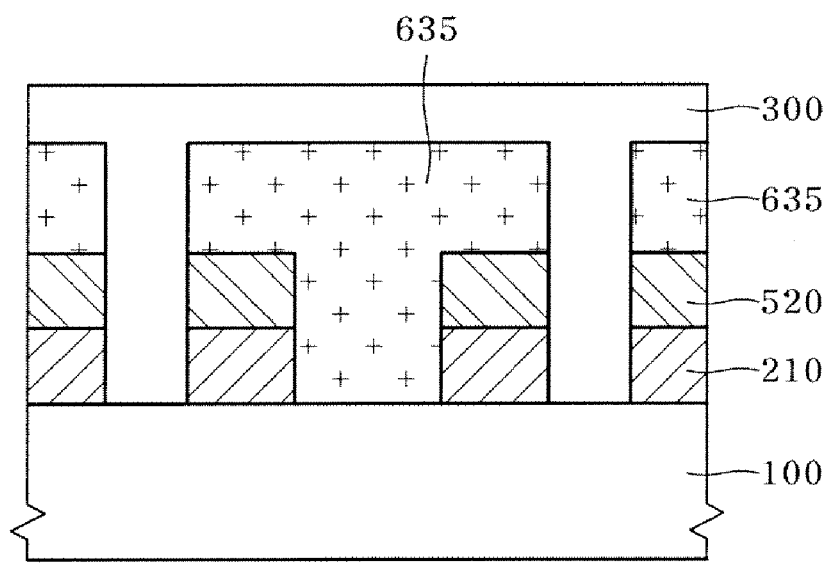

Referring to FIG. 10, a shadow core layer 300 which fills the portion of the substrate 100 corresponding to the shadow core region (705 of FIG. 4) is formed on the second resist pattern 635. The shadow core layer 300 is formed as a light shielding layer which shields incident light upon the exposure. For example, a chromium (Cr) layer is deposited to form the shadow core layer 300.

Figure 11:
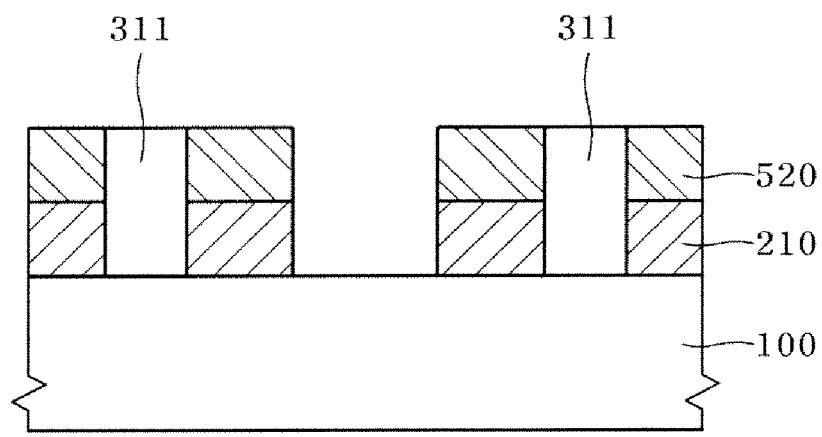

Referring to FIG. 11 together with FIG. 10, the shadow core layer 300 is planarized to form a shadow core layer first pattern 311 having an equal level to the light shielding layer pattern 520. The planarization process is performed as follows: chemical mechanical polishing (CMP) is performed on the shadow core layer 300 so that an upper surface of the light shielding layer pattern (520 of FIG. 10) therebelow by the chemical mechanical polishing. Accordingly, the shadow core layer 300 is remained only in the portion between the stacked patterns of the phase shift layer pattern 210 and the light shielding layer pattern 520 as the shadow core layer first pattern 311. After that, the second resist pattern (635 of FIG. 10) remained after the chemical mechanical polishing is removed by a strip process to expose the surface of the portion 110 of the substrate corresponding to the light transmitting region (701 of FIG. 4) between the phase shift layer patterns 210.

Figure 12:
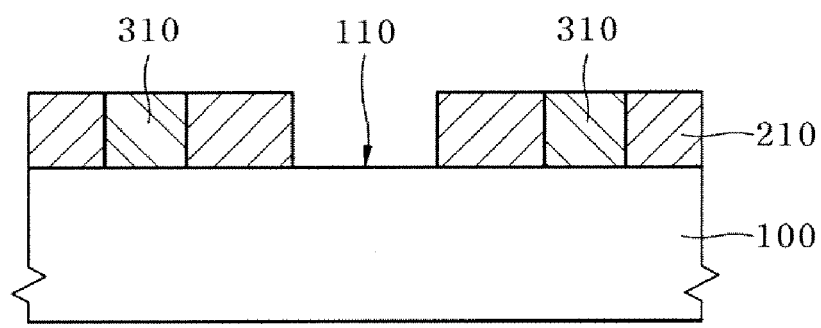

Referring to FIG. 12, the light shielding layer pattern 520 and the remained shadow core layer first pattern 311 are recessed to form a shadow core layer second pattern 310. This recess process is performed as follows: the light shielding layer pattern 520 placed in a frame region (not shown) in the border of the mask except for the patterned to be transferred onto the wafer is shielded, a separate third resist pattern (not shown) which exposes a chip region in which the patterns to be transferred onto the wafer are placed is formed and then the light shielding layer pattern 520 exposed in the chip region is selectively removed to expose an upper surface of the phase shift layer pattern 210 therebelow.

At this time, in the etch process for removing the light shielding layer pattern 520, the shadow core layer first pattern 311 remaining after the chemical mechanical polishing is also etched to have a reduced thickness. The shadow core layer first pattern 311 is etched together with the light shielding layer pattern 520 to have the reduced thickness since it is formed of a chromium layer like the light shielding layer pattern 520. By this recess, the shadow core layer second pattern 310 is patterned so that it remains between the phase shift layer patterns 210 exposed by the removal of the light shielding layer pattern 520.

The phase shift mask formed as such is provided, as illustrated in FIG. 12, so that the portion 110 of the substrate 100 corresponding to the light transmitting region (701 of FIG. 4) is exposed by the phase shift patterns 210 and the portion between the phase shift layer patterns 210 which corresponds to the shadow core region (705 of FIG. 4) is light-shield by the shadow core layer second pattern 310. Since the light incident during the exposure process is shielded by the shadow core layer second pattern 310, light dose and phase of the exposure light transmitted through the phase shift mask and transferred onto the wafer are suggested as illustrated in FIG. 13.

Figure 13:
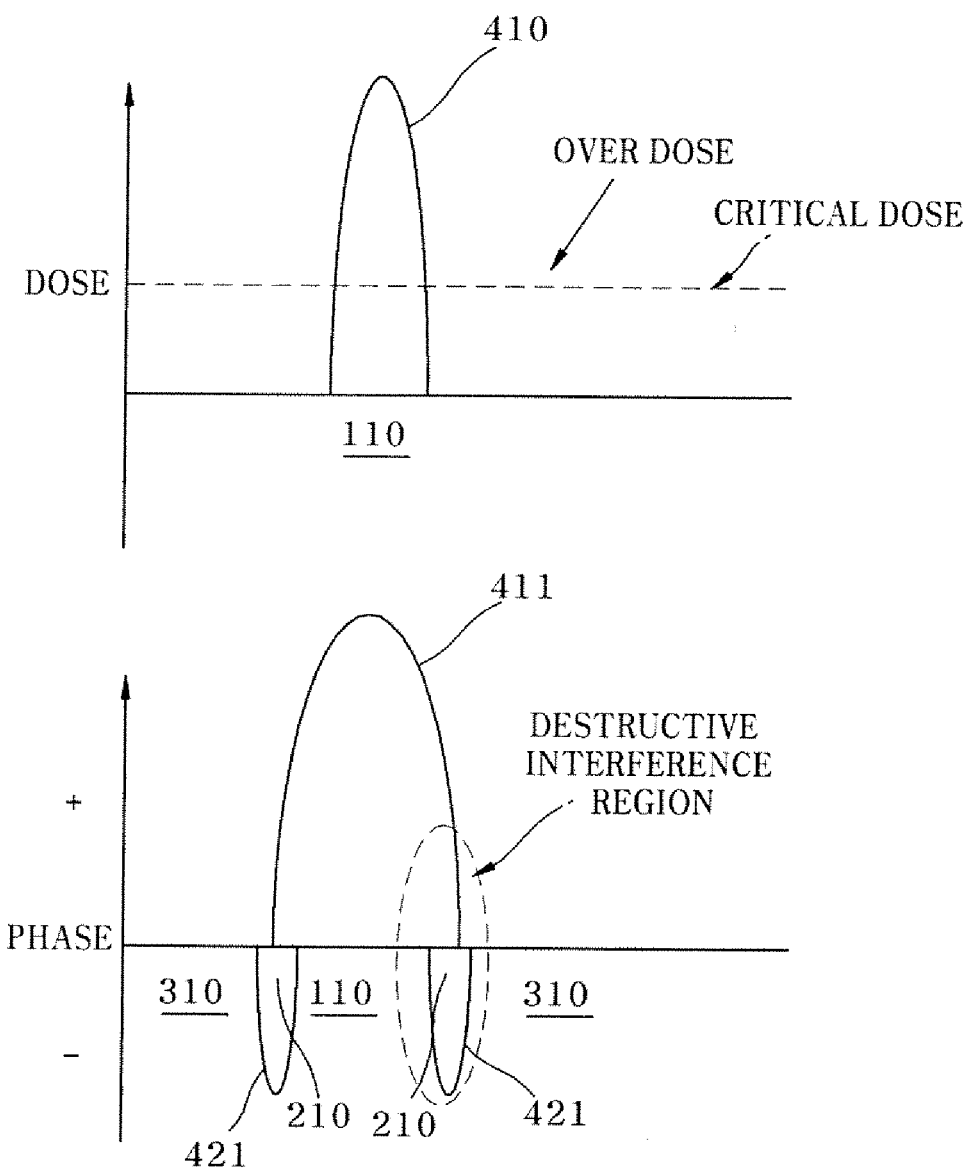
FIG. 13 is a view illustrating light dose and phase of light transmitted through the phase shift mask in accordance with an embodiment of the present invention.

Referring to FIG. 13, the phase 411 of the first light transmitted through the portion of the substrate 100 corresponding to the light transmitted region (701 of FIG. 4) is transferred onto the wafer with a phase of 0°, and the phase 421 of the second light transmitted through the phase shift layer pattern 210 is transferred onto the wafer with the opposite phase (phase of 180°). Since a phase difference is 180° in a boundary between the first light and the second light and, that is to say, the first light and the second light have opposite phases, the first light and the second light are destructively interfered with each other in the boundary and the light dose is thus substantially reduced. Accordingly, in the exposure light 410, only the portion of the first light having a light dose more than the critical dose is transferred onto the wafer.

Since the exposure light incident on the mask region (703 of FIG. 4) is mostly shielded by the shadow core layer second pattern (310 of FIG. 12) introduced between the phase shift layer patterns 210, the light dose of the second light transmitted through the phase shift layer pattern 210 and transferred onto the wafer can be significantly restricted to substantially less than the critical dose. That is to say, since the critical dimension of the phase shift layer pattern 210 is significantly reduced as compared that of the conventional case, the second light transmitted through the phase shift layer pattern 210 is limited in the destructive interference region and most of the dose is destructed by the destructive interference and is thus not transferred onto the wafer. Accordingly, it is possible to solve the over dose problem caused as the light transmitted through the phase shift layer pattern 210 has an excessive dose more than the critical dose and it is therefore possible to introduce a layer of the photoresist to be applied on the wafer during the exposure process as a high sensitive photoresist having enhanced sensitivity. Consequently, it is possible to expose and transfer finer patterns and thus ensure enhancement of a process margin in a photolithography process.

In accordance with the present invention, a shadow core for light-shielding is introduced in a middle portion of a phase shift layer pattern to shield some of the light transmitted through the entire phase shift layer pattern and thus reduce light dose of the light to be transmitted through the phase shift layer pattern. Accordingly, it is possible to restrict that the light dose more than a critical dose is incident on a region not to be exposed and thus restrict poor exposure. Consequently, it is possible to introduce a high sensitive photoresist having quite low critical dose and high sensitivity and thus transfer finer sized circuit patterns onto a wafer.

What is claimed is:

1. A method for fabricating a phase shift mask, comprising:
    forming a phase shift pattern comprising phase shift pattern elements on a light transmitting substrate, wherein the phase shift pattern exposes portions of the substrate corresponding to a light transmitting region and a shadow core region; and
    forming a shadow core layer pattern covering and light-shielding the portion of the substrate corresponding to the shadow core region,
    wherein:
        the shadow core layer pattern comprises shadow core layer pattern elements,
        each shadow core layer pattern element is disposed between adjacent phase shift pattern elements such that opposed sides of the shadow core layer pattern element are each in contact with a phase shift pattern element, and
        the portion of the substrate corresponding to the light transmitting region is exposed by the phase shift pattern and the shadow core layer pattern.

2. The method of claim 1, further comprising forming the phase shift pattern with a molybdenum (Mo) layer so as to phase-shift an incident light to provide a phase shifted light having a phase difference of 180° with respect to a light transmitted through the portion of the substrate corresponding to the light transmitting region.

3. The method of claim 1, further comprising forming the shadow core layer pattern with a chromium (Cr) layer so as to light-shield an incident light.

4. A method for fabricating a phase shift mask, comprising:
    providing a light transmitting substrate on which a phase shift layer and a light shielding layer are sequentially stacked;
    forming a stacked pattern of a light shielding layer pattern and a phase shift layer pattern by selectively etching the light shielding layer and the phase shift layer, wherein portions of the substrate corresponding to a light transmitting region and a shadow core region are exposed by the stacked pattern;
    forming a sacrificial layer pattern which selectively exposes the portion of the substrate corresponding to the shadow core region;
    forming a shadow core layer covering and light-shielding the portion of the substrate corresponding to the shadow core region and exposed by the sacrificial layer pattern;
    planarizing the shadow core layer so that the light shielding layer is exposed;
    exposing the portion of the substrate corresponding to the light transmitting region by removing a remaining portion of the sacrificial layer pattern; and
    forming a shadow core layer pattern by recessing the light shielding layer pattern and the shadow core layer so that the phase shift layer pattern is exposed,
    wherein:
        the phase shift layer pattern comprises phase shift layer pattern elements,
        the shadow core layer pattern comprises shadow core layer pattern elements, and
        each shadow core layer pattern element is disposed between adjacent phase shift layer pattern elements such that opposed sides of the shadow core layer pattern element are each in contact with a phase shift layer pattern element.

5. The method of claim 4, wherein the forming of the stacked pattern of the light shielding layer pattern and the phase shift layer pattern includes: forming a first resist layer on the light shielding layer; forming a first resist pattern by first electron beam exposure and first development so that the layout of the phase shift region is transferred to the first resist layer; and forming the stacked pattern of the light shielding layer pattern and the phase shift layer pattern by selectively etching the light shielding layer and the phase shift layer using the first resist pattern as an etch mask.

6. The method of claim 5, wherein the forming of the sacrificial layer pattern includes: forming a second resist layer which covers the stacked pattern; and forming a second resist pattern which exposes the portion of the substrate corresponding to the shadow core region by second electron beam exposure and second development.

7. The method of claim 6, wherein the forming of the shadow core layer includes: depositing a chromium (Cr) layer, which has a thickness equal to a thickness of the light shielding layer, on the second resist layer.

8. The method of claim 6, wherein the planarizing of the shadow core layer includes exposing a surface of the light shielding layer pattern by sequentially chemical mechanical polishing the shadow core layer and the second resist pattern therebelow.

9. A phase shift mask, comprising:
    a light transmitting substrate comprising a mask region and a light transmitting region;
    a phase shift layer pattern formed on the mask region of the light transmitting substrate and defining a phase shift region, the phase shift layer pattern comprising phase shift layer pattern elements; and
    a shadow core layer pattern formed on the mask region of the light transmitting substrate and defining a shadow core region, the shadow core layer pattern comprising shadow core layer pattern elements, each shadow core layer pattern element being disposed between adjacent phase shift layer pattern elements such that opposed sides of the shadow core layer element are each in contact with a phase shift layer pattern element,
    wherein the light transmitting region of the light transmitting substrate remains exposed by the phase shift layer pattern and the shadow core layer pattern.

10. The phase shift mask of claim 9, wherein at least one of the phase shift layer pattern elements includes a molybdenum (Mo) layer so as to phase-shift an incident light to provide a phase shifted light having a phase difference of 180° with respect to a light transmitted through the portion of the substrate corresponding to the light transmitting region.

11. The phase shift mask of claim 9, wherein the shadow core layer pattern has a thickness equal to that of the phase shift layer pattern.

* * * * *